United States Patent [19]

Petitjean et al.

[11] Patent Number: 4,942,375
[45] Date of Patent: Jul. 17, 1990

[54] VARIABLE ATTENUATION DEVICE INTENDED TO BE INSERTED BETWEEN A TRANSMITTER CIRCUIT AND LOAD CIRCUIT

[75] Inventors: Gilbert Petitjean, Igny; Michel Lebourg, Clamart; Christian Le Tortorec, Montigny Le Bretonneux, all of France

[73] Assignee: U.S. Philips Corporation, New York, N.Y.

[21] Appl. No.: 408,455

[22] Filed: Sep. 15, 1989

Related U.S. Application Data

[63] Continuation of Ser. No. 210,269, Jun. 23, 1988, abandoned.

[30] Foreign Application Priority Data

Jun. 30, 1987 [FR] France .................... 87 09208

[51] Int. Cl.⁵ .............................. H01P 1/22
[52] U.S. Cl. ........................ 333/81 R; 333/81 A; 307/320; 307/540
[58] Field of Search ............ 333/181 A, 81 R, 103; 307/540, 320, 565, 549, 551, 566; 357/58

[56] References Cited

U.S. PATENT DOCUMENTS

| | | | |
|---|---|---|---|
| 3,529,266 | 9/1970 | King | 333/81 R |
| 3,846,724 | 11/1974 | Maier | 333/81 R |
| 4,047,131 | 9/1977 | Ludikhuizo | 333/81 R |
| 4,097,827 | 6/1978 | Williams | 333/81 R |
| 4,216,445 | 8/1980 | Abajian | 333/81 R |
| 4,236,126 | 11/1980 | Weller et al. | 333/81 R |
| 4,378,536 | 3/1983 | Schwarzmann | 333/81 R |
| 4,590,417 | 5/1986 | Tanaami et al. | 307/565 X |
| 4,668,882 | 5/1987 | Matsuura | 333/81 R |

FOREIGN PATENT DOCUMENTS

| | | | |
|---|---|---|---|
| 2912434 | 10/1980 | Fed. Rep. of Germany . | |
| 0044314 | 3/1982 | Japan | 333/81 R |
| 0216311 | 12/1984 | Japan | 333/81 R |
| 0264114 | 12/1985 | Japan | 333/81 R |
| 0200809 | 9/1987 | Japan | 333/81 R |
| 0866618 | 9/1981 | U.S.S.R. | 333/81 R |
| 1293773 | 2/1987 | U.S.S.R. | 333/81 R |

Primary Examiner—Eugene R. Laroche
Assistant Examiner—Seung Ham
Attorney, Agent, or Firm—Thomas A. Briody; Jack E. Haken; Jack D. Slobod

[57] ABSTRACT

A variable attenuation device intended to be inserted between a transmitter circuit having a certain internal impedance and a load circuit; it composed of at least on parallel attenuation branch made up from a variable resistance component (in particular a p-i-n diode) and a bias circuit to vary the resistance of the component as a function of an attenuation control variable. The parallel attenuation branch has a limiting component which is connected in series with the variable resistance component and whose value ensures the matching of the internal impedance of the transmitter circuit.

5 Claims, 1 Drawing Sheet

VARIABLE ATTENUATION DEVICE INTENDED TO BE INSERTED BETWEEN A TRANSMITTER CIRCUIT AND LOAD CIRCUIT

This is a continuation of application Ser. No. 210,269, filed June 23, 1988. (Now abandoned)

BACKGROUND OF THE INVENTION

The present invention relates to a variable attenuation device intended to be inserted between a transmitter circuit having a certain internal impedance and a load circuit, this device being composed of at least one parallel attenuation branch made up from a variable resistance component (p-i-n diode) and a bias circuit to vary the resistance of the component as a function of an attenuation control variable.

Such devices are well known and have important applications, in particular as an amplitude modulator for a radio transmitter, where the modulation functions as an attenuation command variable. In this type of application, in order to obtain a good dynamic range of modulation, attempts are made for it to be possible to handle relatively high power outputs from the transmitter circuit.

The known attenuation devices, for example that described in U.S. Pat. No. 4,009,456, are not suitable for handling large power outputs.

SUMMARY OF THE INVENTION

The object of the present invention is to provide an attenuation device or attenuator capable of handling a high power output.

The attenuator according to the invention comprises a parallel attenuation branch having a limiting component which is connected in series with a variable resistance component and whose value ensures the matching of the internal impedance of the transmitter circuit.

In the application envisaged, to obtain good performance as a modulator, the Applicant has found that the choice of p-i-n diodes is crucial. According to an important feature of the invention, the variable resistance components are p-i-n diodes having minority carrier lifetimes of between 3 and 5 $\mu$s and a slope of the Rs/If characteristic having a value between 35 and 80 $\Omega$ for a current of If=1 mA and a value greater than 350 $\Omega$ for If=100 $\mu$A.

Rs represents the resistance value and If represents the current passing through the p-i-n diode.

BRIEF DESCRIPTION OF THE DRAWING

The description which follows and the accompanying attached drawing will enable the implementation of the invention to be better understood and are given by way of non-limitative example.

DETAILED DESCRIPTION OF THE INVENTION

Figure 1:
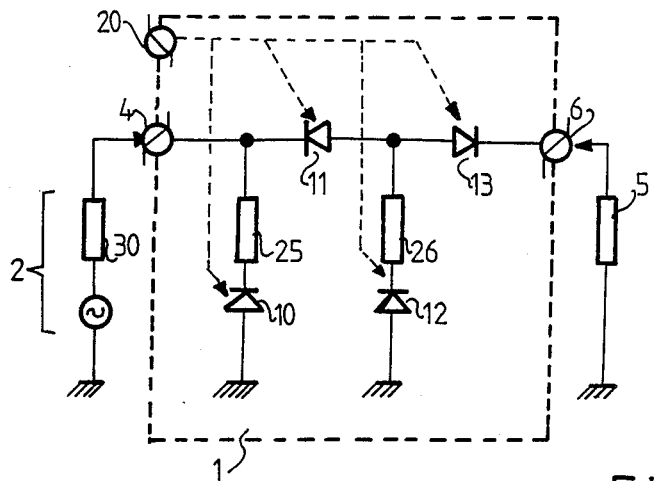
FIG. 1 shows a basic circuit of the attenuation device according to the invention.

In FIG. 1, the reference numeral 1 indicates the attenuation device to be inserted between a transmitter circuit 2, which is connected between the input terminal 4 and ground, and a load circuit 5, which is connected between the output terminal 6 and ground. The device is made up from p-i-n diodes 10, 11, 12 and 13 connected either in parallel (diodes 10 and 12) or in series (diodes 11 and 13). To vary the conduction of these diodes, there is provided a bias circuit, shown only in dotted lines in this FIG. 1, which enables the p-i-n diodes to be biased in a convenient manner from a control voltage applied at control terminal 20.

In accordance with the invention, resistive components 25 and 26 are arranged in series with the diodes 10 and 12, and the value of the resistance of these components is such that it ensures both the matching of the internal resistance of the transmitter circuit 2, shown by the reference numeral 30, and that of the load circuit 5.

Figure 2:
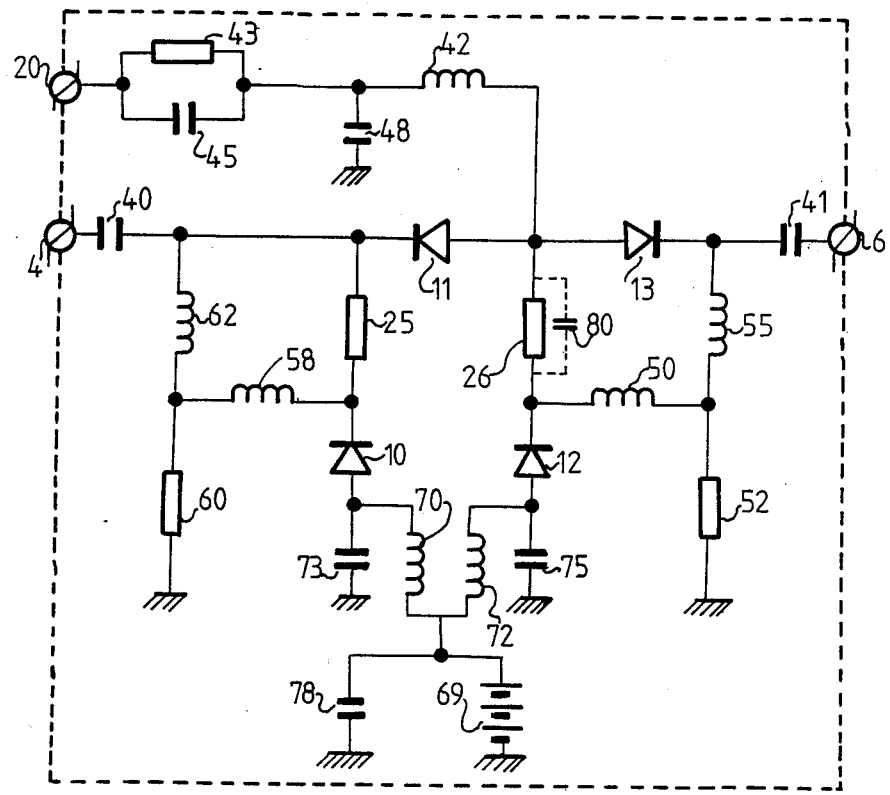
FIG. 2 shows a diagram of the preferred embodiment of the attenuation device according to the invention.

FIG. 2 shows a diagram of an embodiment of the device and gives details of the bias circuit of the diodes 10, 11, 12, 13. The reference numerals representing the components already described in FIG. 1 are unchanged. In order to be able to isolate the device and the transmitter circuit and the load circuit from the point of view of direct current, a first isolating or blocking capacitor 40 is arranged between the terminal 4 and the cathode of the diode 11, and a second isolating or blocking capacitor 41 is arranged between the terminal 6 and the cathode of the diode 13. The anodes of the diodes 11 and 13 are connected to the terminal 20 by means of a choke coil 42 and an R-C circuit composed of a resistor 43 and a capacitor 45 in parallel. A capacitor 48 connects the common point of the choke 42 and the R-C circuit to ground. The anodes of the diodes 11 and 13 are connected to ground for direct current by means of component 26, by a choke 50 and a resistor 52. The cathode of the diode 13 is connected to ground by means of a choke 55 and the abovementioned resistor 52. The cathode of the diode 11 is, again for direct current, connected to ground by means of a first circuit composed of the component 25, a choke 58 and a resistor 60, and by means of a second circuit composed of a choke 62 and the abovementioned resistor 60.

The anodes of the diodes 10 and 12 receive a d.c. voltage originating from a voltage generator 69 and supplied via chokes 70 and 72 respectively. Capacitors 73 and 75 connected to the anodes of diodes 10 and 12 ensure a pathway to ground for high-frequency currents. There may also be provided a capacitor 78 connected parallel to the generator 69. Moreover, the Applicant has found that, by connecting a capacitor 80 of relatively low capacity to the terminals of component 26, the matching of the device is improved.

In the absence of a control voltage at the terminal 20, the generator 69 provides a voltage such that the diodes 10 and 12 are in the on state and the diodes 11 and 13 are in the off state; attenuation is thus at a maximum and the transmitter circuit 2 is shunted by the component 25, whose value corresponds to its internal resistance.

As the voltage at terminal 20 increases, the diodes 11 and 13 begin to conduct and the diodes 10 and 12 conduct less. When the diodes 11 and 13 are at their most conductive and the diodes 10 and 12 are completely turned off attenuation is at a minimum.

The Applicant has found that the values of the components given in the Table below give the best results in the frequency range between 100 MHz and 400 MHz.

TABLE

| Value of the resistors | in ohms |
|---|---|
| 25 | |
| 26 | |
| 43 | 50 |
| 52 | |

TABLE-continued

| 60 | |
|---|---|
| Value of the choke coils | in µH |
| 42 | |
| 50 | |
| 55 | 1 |
| 58 | |
| 62 | |
| 70 | |

| Value of the capacitors | |
|---|---|
| 40 | 470 pF |
| 41 | 470 pF |
| 45 | 0.1 µF |
| 48 | |
| 73 | 470 pF |
| 75 | |
| 78 | |

Aside from these attenuation and loss parameters, the characteristis of the p-i-n diodes have a crucial role, in particular where the distortion of modulation and the harmonic rejection are concerned. In these particular application conditions, two parameters are of paramount importance:
(a) the lifetime of the minority carriers: this must be between 3 and 5 µs.
(b) the slope of the Rs/If characteristic. This can be defined by the value of the "series" resistance at two points of the characteristic: the latter must be between 35 Ω and 80 Ω for $I_F = 1$ mA and greater than 350 Ω for $I_F = 100$ µA. The (special) diodes:

DH 493-19, made by THOMSON-CSF in FRANCE and
DSB6479-42, made by ALPHA INDUSTRIES in the UNITED STATES
are suitable for the device according to the invention.

With these values and transmitter circuits having an internal resistance of 50 Ω equal to that of the load circuit, the S.W.R. (standing-wave ratio) remains below 1.6 for an attenuation varying from less than 2 dB to more than 50 dB, the input power being several watts, the modulation frequencies being between 0 and 25 kHz with a voltage at terminal 20 of from 0 to 10 volts.

It should be pointed out that the attenuation is not a linear function of the voltage applied to the control terminal 20, and it is for the user to provide, upstream of terminal 20, any non-linear circuit which will provide the desired attenuation characteristic.

What is claimed is:

1. A broadband variable attenuator, having a high attenuation range suitable for use as a modulator with a transmitter and a load impedance, said broadband variable attenuator comprising:
    a signal transmission path having an input end and an output end and comprising a series pair of p-i-n diodes of opposite relative polarity in series with the input and output ends of said signal transmission path, whereby the impedance of said signal transmission path is dependent upon the impedance of said series pair of p-i-n diodes;
    a first signal shunt path between the input end of said signal transmission path and ground, said first signal shunt path comprising a p-i-n diode and an impedance element connected in series, said impedance element having an impedance value selected to match an internal impedance of a transmitter connected in operation to said input end of said signal transmission path, whereby the impedance of said first signal shunt path is dependent upon the impedance of said p-i-n diode thereof;
    a second signal shunt path between the junction of said series pair of p-i-n diodes and ground, said second signal shunt path comprising a p-i n diode and an impedance element connected in series, said impedance element having an impedance value selected to match a load impedance connected in operation to said output end of said signal transmission path, whereby the impedance of said second signal shunt path is dependent upon the impedance of said p-i-n diode thereof;
    all of said p-i-n diodes having minority carrier lifetimes of about 3 to 5 microseconds, and a resistance to current ratio between about 35 to 80 ohms at one milliampere and greater than 350 ohms at 100 microamperes; and
    biasing means responsive to a control bias signal for controllably biasing said p-i-n diodes with respective direct currents effective to change the impedance value of said series pair of p-i-n diodes in one direction and simultaneously change the impedance values of said p-i-n diodes of said first and second shunt signal paths in the opposite direction, whereby the attenuation level of said attenuator is variable under control of the control bias signal between a high attenuation level with said signal transmission path having a high impedance and said signal shunt paths having a low impedance, and a low attenuation level with said signal transmission path having a low impedance and said signal shunt paths having a high impedance.

2. A broadband variable attenuator according to claim 1, wherein said biasing means is comprised of
    a bias circuit path for applying the control signal to the junction between said series pair of p-i-n diodes;
    a first inductor and an impedance element connected in series, and the series combination thereof connected between said signal transmission path and ground in parallel with said first signal shunt path;
    a second inductor connected between the junction of said first inductor and its series impedance element and the junction of said p-i-n diode and said impedance element comprising said first shunt a signal path, thereby defining conductive paths for DC bias signals applied from said bias circuit path for biasing one of said series p-i-n diodes;
    a third inductor and an impedance element connected in series, and the series combination thereof connected between said signal transmission path and ground at the output end of signal transmission path; and
    a fourth inductor connected between the junction of said third inductor and its series impedance element and the junction of said p-i-n diode and said impedance element comprising said second shunt signal path, thereby defining conductive paths for DC bias signals applied from said bias circuit path for biasing the other of said series p-i-n diodes.

3. A broadband variable attenuator according to claim 2, further comprising:
    means comprised of a DC signal source for biasing said p-i-n diodes of said first and second signal shunt paths to conductive states and said series pair of p-i-n diodes to non-conductive states to operate said broadband variable attenuator at maximum attenuation in the absence of a control bias signal.

4. A broadband variable attenuator according to claim 3, wherein said means comprised of a DC signal source for biasing is comprised of a positive DC signal source, and a pair of inductors each connected between said positive DC signal source and the anode of a respective one of said p-i-n diodes comprising said shunt signal paths.

5. A broadband variable attenuator according to claim 1, further comprising:
means comprised of a DC signal source for biasing said p-i-n diodes of said first and second signal shunt paths to conductive states and said series pair of p-i-n diodes to non-conductive states to operate said broadband variable attenuator at maximum attenuation in the absence of a control bias signal.

* * * * *